(12) United States Patent
Zhou

(10) Patent No.: US 11,247,234 B2
(45) Date of Patent: Feb. 15, 2022

(54) ULTRASONIC FINGERPRINT RECOGNITION MODULE AND DISPLAY PANEL

(71) Applicant: WUHAN CHINA STAR OPTOELECTRONICS TECHNOLOGY CO., LTD., Hubei (CN)

(72) Inventor: Yongxiang Zhou, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 278 days.

(21) Appl. No.: 16/612,287

(22) PCT Filed: Aug. 30, 2019

(86) PCT No.: PCT/CN2019/103477
§ 371 (c)(1),
(2) Date: Nov. 8, 2019

(87) PCT Pub. No.: WO2020/134150
PCT Pub. Date: Jul. 2, 2020

(65) Prior Publication Data
US 2021/0354170 A1    Nov. 18, 2021

(30) Foreign Application Priority Data

Dec. 28, 2018 (CN) .......................... 201811617094.1

(51) Int. Cl.
*G06F 3/041* (2006.01)
*B06B 1/06* (2006.01)
*H01L 41/257* (2013.01)
*G06K 9/00* (2022.01)
*G06F 3/044* (2006.01)
*G06F 3/043* (2006.01)

(52) U.S. Cl.
CPC .......... *B06B 1/0662* (2013.01); *G06F 3/0412* (2013.01); *G06F 3/0433* (2013.01); *G06F 3/0445* (2019.05); *G06K 9/0002* (2013.01); *H01L 41/257* (2013.01)

(58) Field of Classification Search
CPC .... G06F 3/0412; G06F 3/0433; G06F 3/0445; B06B 1/0662
USPC ........................................................ 345/177
See application file for complete search history.

(56) References Cited

U.S. PATENT DOCUMENTS 10,846,501 B2 * 11/2020 Rasmussen .......... G06K 9/0002
10,929,636 B2 *  2/2021 Lu ........................ G06K 9/0002
2015/0165479 A1   6/2015 Lasiter et al.

FOREIGN PATENT DOCUMENTS

| CN | 202443214 U | 9/2012 |
| CN | 106446817 A | 2/2017 |
| CN | 106711320 A | 5/2017 |

(Continued)

*Primary Examiner* — Calvin C Ma

(57) ABSTRACT

The present invention provides an ultrasonic fingerprint recognition module and a display panel. Advantages of the present invention are that a vibration absorbing layer can absorb mechanical energy of a piezoelectric thin film layer such that a number of cycles of later ultrasound is significantly reduces to extremely increase a vertical resolution of ultrasound fingerprint recognition and overall recognition effect and precision.

15 Claims, 4 Drawing Sheets

(56) References Cited

FOREIGN PATENT DOCUMENTS

| | | |
|---|---|---|
| CN | 107145858 A | 9/2017 |
| CN | 108446685 A | 8/2018 |
| CN | 207690100 U | 8/2018 |

* cited by examiner

ULTRASONIC FINGERPRINT RECOGNITION MODULE AND DISPLAY PANEL

FIELD OF INVENTION

The present invention relates to a field of ultrasonic fingerprint recognition, especially to an ultrasonic fingerprint recognition module and a display panel.

BACKGROUND OF INVENTION

At present, an ultrasound fingerprint recognition technology, because of being free of interference of water and oil, has stronger environmental adaptability, and can be applied in more complicated environments. Therefore, ultrasound fingerprint recognition is value gradually and is applied in various fields for improving safety of electronic devices such as cell phones, computers, tablets and access control systems. Compared to conventional numeral codes, rapidity of fingerprint unlocking facilitates people's life. However, performance of a current ultrasound fingerprint sensor is not desirable.

In the prior art, ultrasonic signal transmitting unit applies voltage on piezoelectric material, the piezoelectric material convert electrical signals into ultrasonic signals. When a finger presses against a cover plate of an ultrasonic fingerprint recognition module, ridges of the fingerprint directly contact the cover plate, and air with greater acoustic resistance exists between valleys of the fingerprint and the cover plate. Therefore, when ultrasonic signals is reflected by a surface of the finger, strengths of ultrasounds reflected from ridges and valleys are different, and these ultrasounds are applied to the piezoelectric material such that different places of the piezoelectric material generate different voltage signals. These voltage signals are outputted to an external circuit through an ultrasonic signal receiving unit and are detected such that a fingerprint image can be identified.

SUMMARY OF INVENTION

Technical Issue

Defects of the conventional ultrasound fingerprint recognition technology are that a number of cycles of ultrasounds generated by the ultrasound piezoelectric material emitting vibration of high frequency, and different ultrasounds could be overlapped such that a number of reflected ultrasounds increases, and signals cannot be identified. When an interval between different ultrasounds is small, difficulty of identifying different vertical pulse waves of the ultrasounds increases, in other words, overlap between different signals raises difficulty of identifying a final signal. If the vertical resolution of an ultrasound fingerprint sensor is insufficient, an echo between ultrasounds cannot be identified and results in great difficulty to post fingerprint analysis and recognition.

Therefore, enhancing a vertical resolution ultrasound fingerprint sensor becomes an important direction of an ultrasound fingerprint sensor with high performance.

Technical Solution

According to the technical issue to be solved, the present invention provides an ultrasonic fingerprint recognition module and a display panel that can extremely increase a vertical resolution of the ultrasound fingerprint recognition and improve overall recognition effect and recognition precision.

To solve the above issue, the present invention provides an ultrasonic fingerprint recognition module, comprising an underlay, a piezoelectric lamination layer disposed on the underlay along a direction perpendicular to the ultrasonic fingerprint recognition module, the piezoelectric lamination layer comprising a vibration absorbing layer disposed on the underlay, a first electrode disposed on the vibration absorbing layer, a piezoelectric thin film layer disposed on the first electrode, and a second electrode disposed on the piezoelectric thin film layer, wherein the vibration absorbing layer is an insulation layer, the vibration absorbing layer comprises an opening, and the underlay, the vibration absorbing layer, and the first electrode enclose and form a resonance chamber in the opening, a circuit is disposed in the underlay, the first electrode and the second electrode are connected to the circuit, and material of the vibration absorbing layer is selected from at least one of butyl rubber, acrylate rubber, nitrile rubber and tantalum rubber, polyurethane, polyvinyl chloride, and epoxy resin.

In an embodiment, an insulation layer is disposed between the piezoelectric lamination layer and the underlay, and the vibration absorbing layer is disposed on the insulation layer.

To solve the above issue, the present invention also provides an ultrasonic fingerprint recognition module comprising an underlay, a piezoelectric lamination layer disposed on the underlay along a direction perpendicular to the ultrasonic fingerprint recognition module, the piezoelectric lamination layer comprising a vibration absorbing layer disposed on the underlay, a first electrode disposed on the vibration absorbing layer, a piezoelectric thin film layer disposed on the first electrode, and a second electrode disposed on the piezoelectric thin film layer.

In an embodiment, the vibration absorbing layer comprises an opening, and the underlay, the vibration absorbing layer, and the first electrode enclose and form a resonance chamber in the opening, a circuit is disposed in the underlay.

In an embodiment, a circuit is disposed in the underlay, and the first electrode and the second electrode are connected to the circuit.

In an embodiment, material of the vibration absorbing layer is selected from at least one of butyl rubber, acrylate rubber, nitrile rubber and tantalum rubber, polyurethane, polyvinyl chloride, and epoxy resin.

In an embodiment, the vibration absorbing layer is an insulation layer.

In an embodiment, an insulation layer is disposed between the piezoelectric lamination layer and the underlay, and the vibration absorbing layer is disposed on the insulation layer.

To solve the above issue, the present invention also provides a display panel comprising an array substrate, and the above ultrasonic fingerprint recognition module is disposed on a surface of the array substrate facing a light emitting side of the display panel.

In an embodiment, the array substrate is the underlay of the ultrasonic fingerprint recognition module.

In an embodiment, the display panel comprises a color substrate disposed opposite to the array substrate, and a liquid crystal layer is disposed between the array substrate and the color substrate.

In an embodiment, the display panel further comprises a lower polarizer, and the lower polarizer is disposed between the array substrate and the liquid crystal layer.

In an embodiment, the display panel further comprises an upper polarizer disposed on a side of the color substrate away from the liquid crystal layer and a cover plate disposed on the upper polarizer.

In an embodiment, the display panel further comprises a touch layer, and the touch layer is disposed between the upper polarizer and the color substrate.

In an embodiment, the display panel further comprises a touch layer, and the touch layer a surface of the color substrate facing the liquid crystal layer.

Advantages

Advantages of the present invention are that the vibration absorbing layer can absorb mechanical energy of the piezoelectric thin film layer such that a number of ultrasound cycles is reduced drastically to extremely increase a vertical resolution of ultrasound fingerprint recognition and improve overall recognition effect and recognition precision.

DETAILED DESCRIPTION OF PREFERRED EMBODIMENTS

Specific embodiments of an ultrasonic fingerprint recognition module and a display panel provided by the present invention will be described in details with accompanying drawings as follows.

Figure 1:
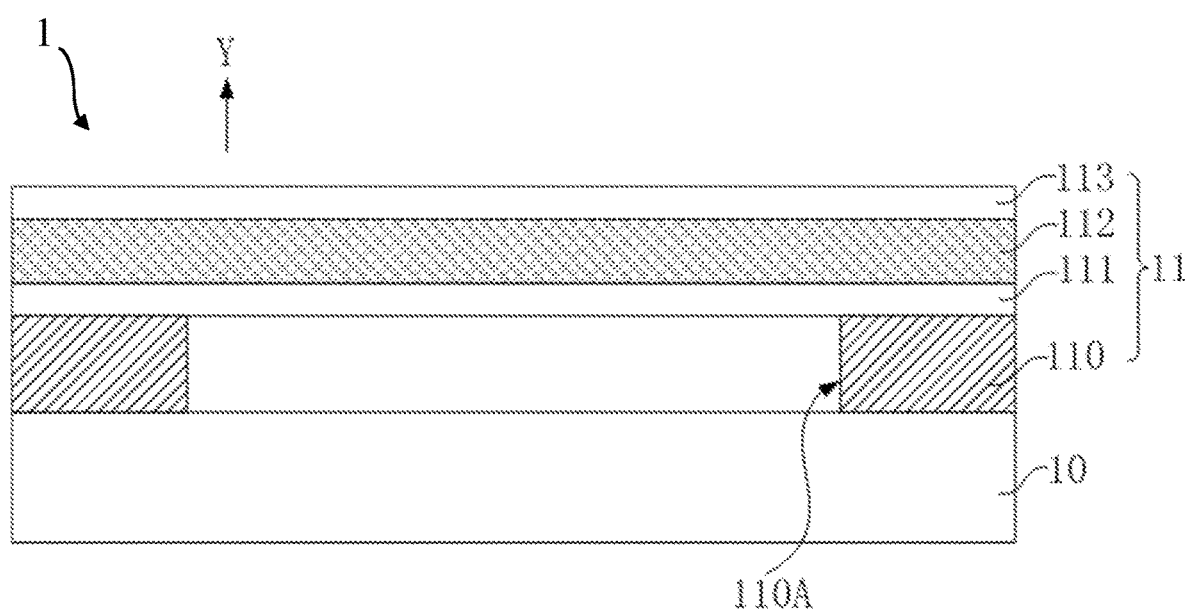
FIG. 1 is a schematic cross-sectional view of a first embodiment of an ultrasonic fingerprint recognition module of the present invention.

The present invention ultrasonic fingerprint recognition module is configured to obtain a fingerprint recognition image of a finger on a sensing surface. FIG. 1 is a schematic cross-sectional view of a first embodiment of an ultrasonic fingerprint recognition module of the present invention. With reference to FIG. 1, the present invention ultrasonic fingerprint recognition module 1 comprises an underlay 10. A piezoelectric lamination layer 11 is disposed on the underlay 10 along a direction perpendicular to the ultrasonic fingerprint recognition module 1. Specifically, in the present embodiment, along a Y-direction as shown in FIG. 1, the piezoelectric lamination layer 11 is disposed on the underlay 10.

The underlay 10 comprises a circuit (not shown in the figures), in the present embodiment, the underlay 10 comprises but is not limited to a thin film transistor (TFT) circuit substrate, the TFT circuit substrate comprises a TFT switch configured to control switching-on and switching-off of the piezoelectric lamination layer 11. The TFT switch is configured to connect the ultrasonic fingerprint recognition module with an external circuit.

The piezoelectric lamination layer 11 comprises a vibration absorbing layer 110 disposed on the underlay 10, a first electrode 111 disposed on the vibration absorbing layer 110, a piezoelectric thin film layer 112 disposed on the first electrode 111, and a second electrode 113 disposed on the piezoelectric thin film layer 112. Specifically, the vibration absorbing layer 110, the first electrode 111, the piezoelectric thin film layer 112, and the second electrode 113 are disposed sequentially along the Y-direction.

Figure 2:
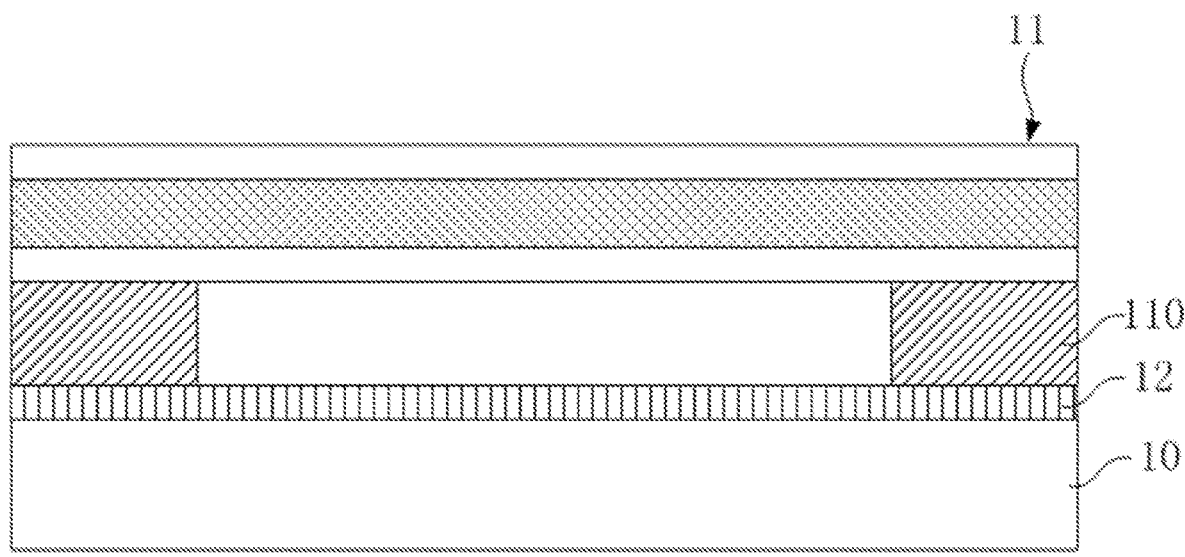
FIG. 2 is a schematic cross-sectional view of a second embodiment of an ultrasonic fingerprint recognition module of the present invention.

The vibration absorbing layer 110 is configured to absorb a part of mechanical energy generated from the vibrating piezoelectric thin film layer 112. In the present embodiment, the vibration absorbing layer 110 is an insulation layer, and material of the vibration absorbing layer 110 is selected from at least one of butyl rubber, acrylate rubber, nitrile rubber and tantalum rubber, polyurethane, polyvinyl chloride, and epoxy resin. In the present invention second embodiment, with reference to FIG. 2, FIG. 2 is a schematic cross-sectional view of a second embodiment of an ultrasonic fingerprint recognition module of the present invention, an insulation layer 12 is disposed between the piezoelectric lamination layer 11 and the underlay 10, and the vibration absorbing layer 110 is disposed on the insulation layer 12. Advantages of the present embodiment compared to the second embodiment are that the vibration absorbing layer 110 not only serves as a vibration absorbing layer but also serves as an insulation layer, which is structurally simple, keeps a thickness of the ultrasonic fingerprint recognition module from increasing, and has a simplified process and a lowered cost. In the present embodiment, the material of the vibration absorbing layer 110 is insulating and has an excellent damping effect and a wide range of temperature for use, which can fulfill use of a range from 50 to 200° C. The material of the vibration absorbing layer 110 is also cheap and has a simple manufacturing process and a low manufacturing cost.

Furthermore, in the present embodiment, as shown in FIG. 1, the vibration absorbing layer 110 has an opening 110A, the opening 110A is defined through the vibration absorbing layer 110. In a place of the opening 110A, the underlay 10, the vibration absorbing layer 11, and the first electrode 111 enclose and form a hermetic resonance chamber, the resonance chamber increase amplitude of ultrasound.

Material of the first electrode 111 can be selected from one or more of Ag, Al, Mo, Au, Cr, Ni, Cu, Pt, and alloy thereof. Material of the second electrode 113 can be selected from one or more of Ag, Al, Mo, Au, Cr, Ni, Cu, Pt, and alloy thereof. the piezoelectric thin film layer 112 can be selected from at least one of aluminum nitride (AlN), lead zirconate titanate (PZT), polyvinylidene fluoride (PVDF), and polyvinylidene fluoride-trifluoroethylene copolymer (P(VDF-TrFE)).

When the present invention ultrasonic fingerprint recognition module works, an external circuit applies voltage to the first electrode 111 and the second electrode 113, a voltage difference exists between the first electrode 111 and the second electrode 113. Such voltage signals are applied to the corresponding piezoelectric thin film layer 112 to make the piezoelectric thin film layer 112 vibrate in high frequency to emit ultrasound upward. Such ultrasonic signals are reflected when transmitted to a finger on a sensing surface (not shown in the figures), and the piezoelectric thin film layer 112 receives the ultrasonic signals reflected back, and converts the received ultrasonic signals into electrical signals, the electrical signals are converted into a fingerprint recognition image. A fingerprint recognition image of the finger can be formed according to the electrical signals. Specifically, the fingerprint of the finger comprises fingerprint ridges and fingerprint valleys, because the fingerprint ridges directly contact the sensing surface, and air is filled between the fingerprint valleys and sensing surface, an acoustic impedance of the fingerprint ridges corresponding to the sensing surface is different from an acoustic impedance of the fingerprint valleys corresponding to the sensing surface. When the transmitting signals are respectively transmitted to the sensing surface and reach the fingerprint ridges and the fingerprint valleys of the finger, on the fingerprint ridges, a part of the transmitting signals are absorbed by the fingerprint ridges and another part of the transmitting signals form reflective signals that are reflected to the piezoelectric thin film layer 112. In the fingerprint valleys, most of the transmitting signals form reflective signals that are reflected to the piezoelectric thin film layer 112. Energy difference exists between two kinds of reflective signals to form a fingerprint recognition image.

During vibration of the piezoelectric thin film layer 112, the vibration absorbing layer 110 can absorb the mechanical energy to significantly reduce a number of cycles of later ultrasound to further drastically increase a vertical resolution of ultrasound fingerprint recognition and overall recognition effect and precision. At the same time, because the vibration absorbing layer 110 does not directly contact the piezoelectric thin film layer 112, the vibration absorbing layer 110 would not absorb energy of vibration.

Furthermore, a thickness of the vibration absorbing layer 110 can be designed and adjusted as needed to precisely adjust an effect of the vibration absorbing layer 110 and acoustic pressure of the ultrasound to acquire the desired ultrasonic acoustic pressure and lower the number of the cycles of the ultrasound. The vibration absorbing layer 110 does not significantly absorb the mechanical energy of the vibrating piezoelectric thin film layer 112 in the beginning of the vibration. With the vibration proceeding, energy absorption becomes more and more significantly. Therefore, the vibration absorbing layer 110 has minor influence to a first pulse wave generated from the piezoelectric thin film layer 112, and would not has significant influence to a signal to noise ratio. However, the vibration absorbing layer 110 can significantly absorb late energy of the ultrasound to increase the vertical resolution of ultrasound fingerprint recognition. Therefore, subsequent difficulty of ultrasound analysis and recognition of fingerprint valleys and fingerprint ridges are notably lowered, and a corresponding algorithm can be simplified such that a speed of recognition is increased.

Figure 3:
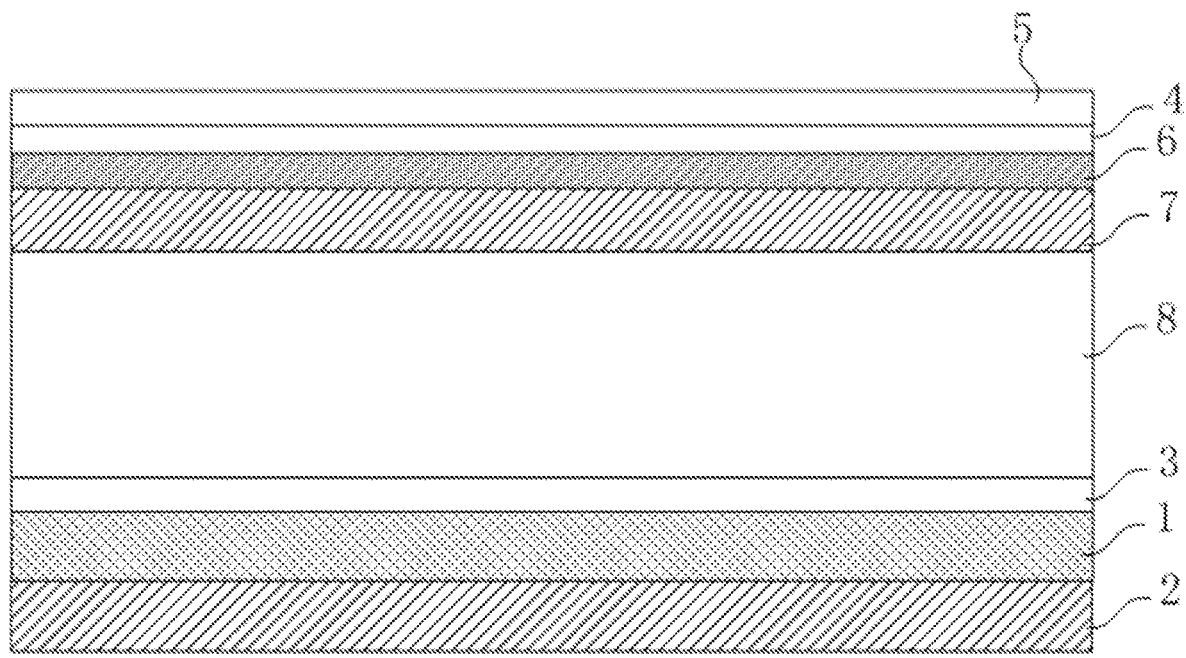
FIG. 3 is a schematic cross-sectional view of a first embodiment of a display panel of the present invention.

The present invention also provides a display panel. FIG. 3 is a schematic cross-sectional view of a first embodiment of a display panel of the present invention. With reference to FIG. 3, the display panel comprises an array substrate 2. The above ultrasonic fingerprint recognition module is disposed on a surface of the array substrate 2 facing a light emitting side of the display panel. Specifically, in the present embodiment, the display panel 2 further comprises a color substrate 7 disposed opposite to the array substrate 2. A liquid crystal layer 8 is disposed between the array substrate 2 and the color substrate 7. The ultrasonic fingerprint recognition module 1 is disposed on a side of the array substrate 2 facing the liquid crystal layer 8. The ultrasonic fingerprint recognition module 1 can be disposed in a displaying region of the display panel, and alternatively can be disposed in a non-displaying region of the display panel. The array substrate 2 can serve as an underlay of the ultrasonic fingerprint recognition module 1.

Furthermore, in the present embodiment, the display panel further comprises a lower polarizer 3, an upper polarizer 4, a cover plate 5 and a touch layer 6. The lower polarizer 3 is disposed between the array substrate 2 and the liquid crystal layer 8, in other words, the lower polarizer 3 is disposed on an upper surface of the array substrate. The upper polarizer 4 is disposed on a side of the color substrate 7 away from the liquid crystal layer 8. The cover plate 5 is disposed on the upper polarizer 4, in other words, the cover plate 5 is disposed on a surface of the upper polarizer 4 away from the color substrate 7. the touch layer 6 is disposed between the upper polarizer 4 and the color substrate 7, in other words, the display panel of the present embodiment is the conventional on-sell structure. An upper surface of the cover plate 5 can serve as a sensing surface of the ultrasonic fingerprint recognition module 1. The cover plate 5 comprises light transmissive material to provide a protection function, and it can be glass, sapphire or transparent polymer material. The touch layer 6 is a plug-in touch layer, and a refractive index of medium material thereof corresponds to a refractive index of the cover plate 5. The array substrate 2, the color substrate 7, the liquid crystal layer 8, the lower polarizer 3, the upper polarizer 4, the cover plate 5, and the touch layer 6 are common structures in the art and will not be described repeatedly.

Figure 4:
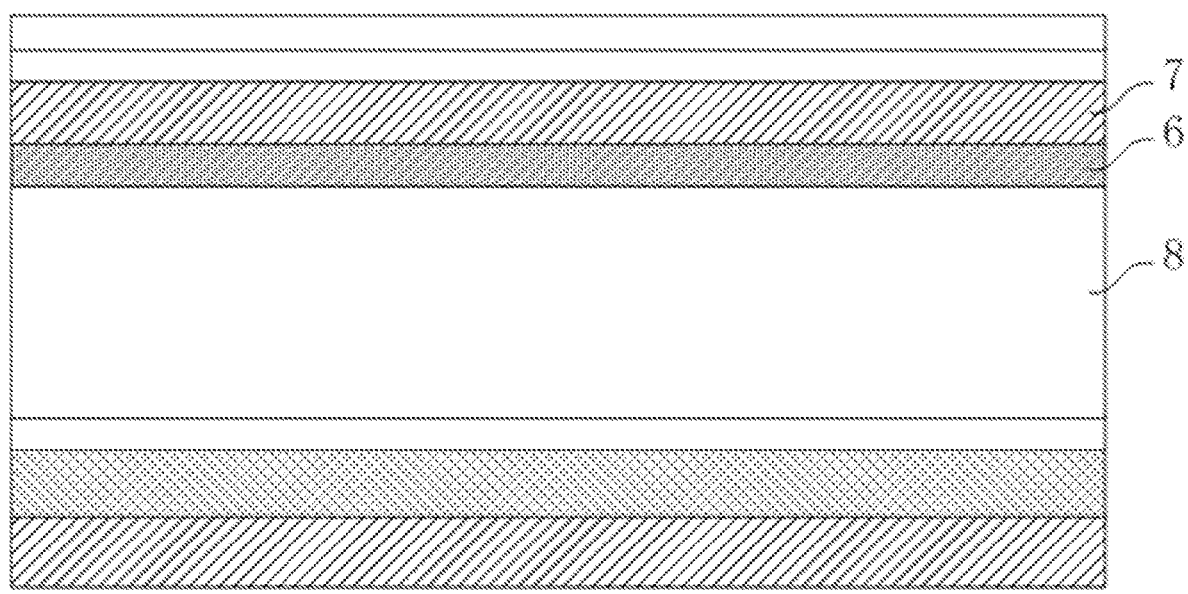
FIG. 4 is a schematic cross-sectional view of a second embodiment of a display panel of the present invention.

FIG. 4 is a schematic cross-sectional view of a second embodiment of a display panel of the present invention. With reference to FIG. 4, a difference of the second embodiment from the first embodiment lies in that the touch layer 6 is disposed on a surface of the color substrate 7 facing the liquid crystal layer 8. In other words, the display panel of the present embodiment is the conventional in-sell structure.

The above is only preferred embodiments of the present invention. It should be noted that a person of ordinary skill in the art can make several improvements and modifications without departing from the principle of the present invention. These improvements and modifications should also be considered to be within the scope of protection of the present invention.

INDUSTRIAL APPLICABILITY

The subject matter of the present invention can be manufactured and employed in industries and therefore has industrial applicability.

What is claimed is:

1. An ultrasonic fingerprint recognition module, comprising an underlay, a piezoelectric lamination layer disposed on the underlay along a direction perpendicular to the ultrasonic fingerprint recognition module, the piezoelectric lamination layer comprising a vibration absorbing layer disposed on the underlay, a first electrode disposed on the vibration absorbing layer, a piezoelectric thin film layer disposed on the first electrode, and a second electrode disposed on the piezoelectric thin film layer, wherein the vibration absorbing layer is an insulation layer, the vibration absorbing layer comprises an opening, and the underlay, the vibration absorbing layer, and the first electrode enclose and form a resonance chamber in the opening, a circuit is disposed in the underlay, the first electrode and the second electrode are connected to the circuit, and material of the vibration absorbing layer is selected from at least one of butyl rubber, acrylate rubber, nitrile rubber and tantalum rubber, polyurethane, polyvinyl chloride, and epoxy resin.

2. The ultrasonic fingerprint recognition module as claimed in claim 1, wherein an insulation layer is disposed between the piezoelectric lamination layer and the underlay, and the vibration absorbing layer is disposed on the insulation layer.

3. An ultrasonic fingerprint recognition module, comprising an underlay, a piezoelectric lamination layer disposed on the underlay along a direction perpendicular to the ultrasonic fingerprint recognition module, the piezoelectric lamination layer comprising a vibration absorbing layer disposed on the underlay, a first electrode disposed on the vibration absorbing layer, a piezoelectric thin film layer disposed on the first electrode, and a second electrode disposed on the piezoelectric thin film layer.

4. The ultrasonic fingerprint recognition module as claimed in claim 3, wherein the vibration absorbing layer comprises an opening, and the underlay, the vibration absorbing layer, and the first electrode enclose and form a resonance chamber in the opening, a circuit is disposed in the underlay.

5. The ultrasonic fingerprint recognition module as claimed in claim 3, wherein a circuit is disposed in the underlay, and the first electrode and the second electrode are connected to the circuit.

6. The ultrasonic fingerprint recognition module as claimed in claim 3, wherein material of the vibration absorbing layer is selected from at least one of butyl rubber, acrylate rubber, nitrile rubber and tantalum rubber, polyurethane, polyvinyl chloride, and epoxy resin.

7. The ultrasonic fingerprint recognition module as claimed in claim 3, wherein the vibration absorbing layer is an insulation layer.

8. The ultrasonic fingerprint recognition module as claimed in claim 3, wherein an insulation layer is disposed between the piezoelectric lamination layer and the underlay, and the vibration absorbing layer is disposed on the insulation layer.

9. A display panel, comprising an array substrate, wherein the ultrasonic fingerprint recognition module as claimed in claim 3 is disposed on a surface of the array substrate facing a light emitting side of the display panel.

10. The display panel as claimed in claim 9, wherein the array substrate is the underlay of the ultrasonic fingerprint recognition module.

11. The display panel as claimed in claim 9, wherein the display panel comprises a color substrate disposed opposite to the array substrate, and a liquid crystal layer is disposed between the array substrate and the color substrate.

12. The display panel as claimed in claim 11, wherein the display panel further comprises a lower polarizer, and the lower polarizer is disposed between the array substrate and the liquid crystal layer.

13. The display panel as claimed in claim 11, wherein the display panel further comprises an upper polarizer disposed on a side of the color substrate away from the liquid crystal layer and a cover plate disposed on the upper polarizer.

14. The display panel as claimed in claim 11, wherein the display panel further comprises a touch layer, and the touch layer is disposed between the upper polarizer and the color substrate.

15. The display panel as claimed in claim 11, wherein the display panel further comprises a touch layer, and the touch layer a surface of the color substrate facing the liquid crystal layer.

* * * * *